US011827143B2

(12) United States Patent
Scott et al.

(10) Patent No.: US 11,827,143 B2
(45) Date of Patent: Nov. 28, 2023

(54) EMBOSSED SMART FUNCTIONAL PREMIUM NATURAL LEATHER

(71) Applicant: Honda Motor Co., Ltd., Tokyo (JP)

(72) Inventors: Patricia A. Scott, Galloway, OH (US); Zainab I. Ali, Marysville, OH (US)

(73) Assignee: HONDA MOTOR CO., LTD., Tokyo (JP)

(*) Notice: Subject to any disclaimer, the term of this patent is extended or adjusted under 35 U.S.C. 154(b) by 0 days.

(21) Appl. No.: 17/308,609

(22) Filed: May 5, 2021

(65) Prior Publication Data
US 2021/0253024 A1    Aug. 19, 2021

Related U.S. Application Data

(63) Continuation of application No. 16/857,548, filed on Apr. 24, 2020, now Pat. No. 11,027,647, which is a
(Continued)

(51) Int. Cl.
*B60Q 3/233* (2017.01)
*H05K 1/02* (2006.01)
(Continued)

(52) U.S. Cl.
CPC ............ *B60Q 3/233* (2017.02); *B60Q 3/283* (2017.02); *B60Q 3/54* (2017.02); *B60Q 3/745* (2017.02); *B60Q 3/80* (2017.02); *B60Q 3/82* (2017.02); *B60R 13/02* (2013.01); *H05K 1/0274* (2013.01); *H05K 1/0283* (2013.01); *H05K 1/038* (2013.01); *H05K 1/0393* (2013.01); *H05K 3/284* (2013.01); *B60R 2013/0287* (2013.01); *H05K 1/032* (2013.01); *H05K 1/095* (2013.01);
(Continued)

(58) Field of Classification Search
CPC ........................................................ B60Q 3/70
USPC ........................................................ 320/108
See application file for complete search history.

(56) References Cited

U.S. PATENT DOCUMENTS 3,049,077 A   8/1962   Damm, Jr.
3,075,280 A   1/1963   Jack et al.
(Continued)

FOREIGN PATENT DOCUMENTS

AT   519037   3/2018
AT   519702   9/2018
(Continued)

OTHER PUBLICATIONS

Office Action of U.S. Appl. No. 16/821,568 dated Jun. 7, 2022, 134 pages.
(Continued)

*Primary Examiner* — Suchin Parihar
(74) *Attorney, Agent, or Firm* — RANKIN, HILL & CLARK LLP

(57) ABSTRACT

A smart functional leather assembly includes a leather substrate, an electronic circuit layer including one or more conductive traces and optional electronic elements arranged on the leather substrate, optionally a pigmented coating arranged on the circuit layer, and an optional anti-soiling layer arranged on the pigmented layer. The entire smart functional leather assembly, including the circuit, are embossed to provide an embossed smart functional leather assembly with an embossed pattern.

20 Claims, 3 Drawing Sheets

Related U.S. Application Data continuation of application No. 16/185,633, filed on Nov. 9, 2018, now Pat. No. 10,682,952, which is a continuation-in-part of application No. 15/635,862, filed on Jun. 28, 2017, now Pat. No. 10,272,836, and a continuation-in-part of application No. 15/635,838, filed on Jun. 28, 2017, now Pat. No. 10,742,061, and a continuation-in-part of application No. 15/635,803, filed on Jun. 28, 2017.

(60) Provisional application No. 62/667,178, filed on May 4, 2018.

(51) Int. Cl.

| | | |
|---|---|---|
| B60Q 3/283 | (2017.01) | |
| B60Q 3/54 | (2017.01) | |
| B60R 13/02 | (2006.01) | |
| H05K 1/03 | (2006.01) | |
| B60Q 3/74 | (2017.01) | |
| B60Q 3/82 | (2017.01) | |
| H05K 3/28 | (2006.01) | |
| B60Q 3/80 | (2017.01) | |
| H05K 3/00 | (2006.01) | |
| H05K 1/09 | (2006.01) | |
| H05K 1/18 | (2006.01) | |

(52) U.S. Cl.
CPC ........... *H05K 1/181* (2013.01); *H05K 3/0014* (2013.01); *H05K 2201/10053* (2013.01); *H05K 2201/10106* (2013.01); *H05K 2201/10151* (2013.01); *H05K 2203/0143* (2013.01)

(56) References Cited

U.S. PATENT DOCUMENTS

| | | |
|---|---|---|
| 3,391,846 A | 7/1968 | White |
| 3,549,304 A | 12/1970 | Ebel et al. |
| 4,964,674 A | 10/1990 | Altmann et al. |
| 5,002,335 A | 3/1991 | Bengtsson |
| 5,622,652 A | 4/1997 | Kucherovsky et al. |
| 5,624,736 A | 4/1997 | DeAngelis et al. |
| 5,763,058 A | 6/1998 | Isen et al. |
| 5,843,263 A | 12/1998 | Mitchell |
| 5,948,297 A | 9/1999 | Haubner et al. |
| 6,106,920 A | 8/2000 | Pichon et al. |
| 6,311,350 B1 | 11/2001 | Kaiserman et al. |
| 6,345,839 B1 | 2/2002 | Kuboki et al. |
| 6,371,604 B1 | 4/2002 | Yamane et al. |
| 6,395,121 B1 | 5/2002 | De Bastiani |
| 6,545,236 B2 | 4/2003 | Valk et al. |
| 6,579,593 B1 | 6/2003 | Mori et al. |
| 6,607,681 B1 | 8/2003 | Ito et al. |
| 6,652,128 B2 | 11/2003 | Misaras |
| 6,697,694 B2 | 2/2004 | Mogensen |
| 6,729,025 B2 | 5/2004 | Farrell et al. |
| 6,820,897 B2 | 11/2004 | Breed et al. |
| 6,868,934 B2 | 3/2005 | Dirrig |
| 7,301,351 B2 | 11/2007 | Deangelis et al. |
| 7,395,717 B2 | 7/2008 | DeAngelis et al. |
| 7,432,459 B2 | 10/2008 | Stoschek et al. |
| 7,516,809 B2 | 4/2009 | Tetzenecker et al. |
| 7,710,279 B1 | 5/2010 | Fields |
| 7,719,007 B2 | 5/2010 | Tompkins et al. |
| 7,808,488 B2 | 10/2010 | Martin et al. |
| 7,989,725 B2 | 8/2011 | Boddie et al. |
| 8,114,791 B2 | 2/2012 | Child et al. |
| 8,315,061 B2 | 11/2012 | Ullmann et al. |
| 8,330,079 B2 | 12/2012 | Yasuda et al. |
| 8,463,352 B2 | 6/2013 | Song |
| 8,497,850 B2 | 7/2013 | Foerster et al. |
| 8,506,141 B2 | 8/2013 | Cannon et al. |
| 8,507,102 B1 | 8/2013 | O'Leary |
| 8,552,299 B2 | 10/2013 | Rogers et al. |
| 8,587,422 B2 | 11/2013 | Andrews et al. |
| 8,704,758 B1 | 4/2014 | Figley et al. |
| 8,725,230 B2 | 5/2014 | Lisseman et al. |
| 8,732,866 B2 | 5/2014 | Genz et al. |
| 8,784,342 B2 | 7/2014 | Hyde et al. |
| 8,804,344 B2 | 8/2014 | Moncrieff |
| 8,985,012 B2 | 3/2015 | Yiannakou |
| 8,999,431 B2 | 4/2015 | Nagarajan et al. |
| 9,108,402 B2 | 8/2015 | Sudo et al. |
| 9,112,363 B2 | 8/2015 | Partovi |
| 9,159,221 B1 | 10/2015 | Stantchev |
| 9,180,803 B2 | 11/2015 | Cleary et al. |
| 9,192,031 B2 | 11/2015 | Deyaf |
| 9,210,498 B1 | 12/2015 | Shaffer |
| 9,372,123 B2 | 6/2016 | Li et al. |
| 9,403,460 B2 | 8/2016 | Hickey et al. |
| 9,416,495 B2 | 8/2016 | Depres et al. |
| 9,421,884 B2 | 8/2016 | Boyer et al. |
| 9,448,631 B2 | 9/2016 | Winter et al. |
| 9,481,297 B2 | 11/2016 | Salter et al. |
| 9,554,732 B2 | 1/2017 | Schaffer |
| 9,576,446 B2 | 2/2017 | Zellers |
| 9,672,703 B2 | 6/2017 | Alexiou et al. |
| 9,715,687 B1 | 7/2017 | Lau et al. |
| 9,723,122 B2 | 8/2017 | Ghaffari et al. |
| 9,724,869 B2 | 8/2017 | Niskala et al. |
| 9,800,079 B2 | 10/2017 | Wippler |
| 9,821,680 B2 | 11/2017 | Lange-Mao |
| 9,873,446 B2 | 1/2018 | Gardner et al. |
| 9,875,866 B2 | 1/2018 | Liao et al. |
| 9,886,093 B2 | 2/2018 | Moussette et al. |
| 9,973,021 B2 | 5/2018 | Leabman et al. |
| 10,638,618 B1 | 4/2020 | Teil et al. |
| 2002/0084721 A1 | 7/2002 | Walczak |
| 2002/0104746 A1* | 8/2002 | Valk ..................... B60Q 1/1484 200/61.54 |
| 2007/0052529 A1 | 3/2007 | Perez |
| 2007/0149001 A1 | 6/2007 | Uka |
| 2007/0236450 A1 | 10/2007 | Colgate et al. |
| 2007/0265738 A1 | 11/2007 | Saito |
| 2008/0157533 A1 | 7/2008 | Flottemesch et al. |
| 2008/0202912 A1 | 8/2008 | Boddie et al. |
| 2008/0257706 A1 | 10/2008 | Haag |
| 2008/0303800 A1 | 12/2008 | Elwell |
| 2009/0004478 A1 | 1/2009 | Baetzold et al. |
| 2009/0061251 A1 | 3/2009 | Kirmeier |
| 2009/0108985 A1 | 4/2009 | Haag et al. |
| 2009/0251917 A1* | 10/2009 | Wollner .................. B60Q 3/54 362/543 |
| 2009/0301852 A1 | 12/2009 | Keist et al. |
| 2010/0137702 A1 | 6/2010 | Park et al. |
| 2010/0206614 A1 | 8/2010 | Park et al. |
| 2011/0018498 A1 | 1/2011 | Soar |
| 2011/0209976 A1 | 9/2011 | Krier et al. |
| 2011/0267795 A1 | 11/2011 | Kim et al. |
| 2012/0113667 A1 | 5/2012 | Brandt et al. |
| 2012/0235566 A1 | 9/2012 | Karalis et al. |
| 2013/0126940 A1 | 5/2013 | Simone et al. |
| 2013/0160183 A1 | 6/2013 | Reho et al. |
| 2013/0192412 A1 | 8/2013 | Sekiya et al. |
| 2013/0299598 A1 | 11/2013 | Finn |
| 2014/0022070 A1 | 1/2014 | Golomb |
| 2014/0036428 A1 | 2/2014 | Leong et al. |
| 2014/0054919 A1 | 2/2014 | Deuvrard et al. |
| 2014/0084045 A1 | 3/2014 | Yang et al. |
| 2014/0109719 A1 | 4/2014 | Lisseman et al. |
| 2014/0203770 A1 | 7/2014 | Salter et al. |
| 2014/0240132 A1 | 8/2014 | Bychkov |
| 2014/0246415 A1 | 9/2014 | Wittkowski |
| 2014/0265555 A1 | 9/2014 | Hall et al. |
| 2014/0310610 A1 | 10/2014 | Ricci |
| 2014/0354568 A1 | 12/2014 | Andrews et al. |
| 2015/0017421 A1 | 1/2015 | Sotzing |
| 2015/0077969 A1 | 3/2015 | Moncrieff |
| 2015/0175172 A1 | 6/2015 | Truong |
| 2015/0196209 A1 | 7/2015 | Morris et al. |
| 2015/0250420 A1 | 9/2015 | Longinotti-Buitoni et al. |
| 2015/0261264 A1 | 9/2015 | Brown et al. |

(56) References Cited

U.S. PATENT DOCUMENTS

| | | | |
|---|---|---|---|
| 2015/0288048 A1 | 10/2015 | Tang et al. | |
| 2015/0344060 A1 | 12/2015 | Staszak et al. | |
| 2015/0352953 A1 | 12/2015 | Koravadi | |
| 2015/0375677 A1* | 12/2015 | Salter | F21V 9/32 |
| | | | 362/510 |
| 2015/0376832 A1 | 12/2015 | Li et al. | |
| 2015/0378254 A1 | 12/2015 | Wang et al. | |
| 2016/0004362 A1 | 1/2016 | Kring et al. | |
| 2016/0007475 A1 | 1/2016 | Zanesi | |
| 2016/0042268 A1 | 2/2016 | Puttkammer | |
| 2016/0144690 A1 | 5/2016 | Wittkowski et al. | |
| 2016/0167130 A1 | 6/2016 | Ida et al. | |
| 2016/0218712 A1 | 7/2016 | Ben Abdelaziz | |
| 2016/0264078 A1 | 9/2016 | McGuire, Jr. et al. | |
| 2016/0272112 A1 | 9/2016 | DeGrazia et al. | |
| 2016/0276865 A1 | 9/2016 | Pike et al. | |
| 2016/0311366 A1* | 10/2016 | Lisseman | G02B 6/0093 |
| 2016/0327979 A1 | 11/2016 | Lettow | |
| 2017/0012207 A1 | 1/2017 | Seo et al. | |
| 2017/0022379 A1 | 1/2017 | Loccufier et al. | |
| 2017/0038795 A1 | 2/2017 | Lettow et al. | |
| 2017/0052624 A1 | 2/2017 | Hunt et al. | |
| 2017/0061753 A1 | 3/2017 | Khoshkava et al. | |
| 2017/0092098 A1 | 3/2017 | Alampallam et al. | |
| 2017/0101547 A1 | 4/2017 | Loccufier et al. | |
| 2017/0126228 A1* | 5/2017 | Gerken | H03K 17/9622 |
| 2017/0137050 A1 | 5/2017 | Michelmann et al. | |
| 2017/0147106 A1 | 5/2017 | Kwon et al. | |
| 2017/0166237 A1 | 6/2017 | Oh et al. | |
| 2017/0174124 A1 | 6/2017 | Salter et al. | |
| 2017/0291493 A1 | 10/2017 | Bostick et al. | |
| 2017/0308778 A1 | 10/2017 | Foerster et al. | |
| 2017/0310144 A1 | 10/2017 | Madau et al. | |
| 2017/0311666 A1 | 11/2017 | Gladish et al. | |
| 2017/0325518 A1 | 11/2017 | Poupyrev et al. | |
| 2017/0325524 A1 | 11/2017 | Hyde et al. | |
| 2017/0325525 A1 | 11/2017 | Hyde et al. | |
| 2017/0326013 A1 | 11/2017 | Hyde et al. | |
| 2017/0337462 A1 | 11/2017 | Thiele et al. | |
| 2017/0341573 A1 | 11/2017 | Gerhard et al. | |
| 2018/0149321 A1 | 5/2018 | Torvinen | |
| 2018/0208111 A1* | 7/2018 | Lisseman | B60K 35/00 |
| 2018/0290356 A1 | 10/2018 | Isohätälä et al. | |
| 2018/0352661 A1 | 12/2018 | Yang et al. | |
| 2019/0001879 A1 | 1/2019 | Ali et al. | |
| 2019/0008050 A1 | 1/2019 | Ali et al. | |
| 2019/0009812 A1 | 1/2019 | Jendrowski et al. | |
| 2019/0077311 A1 | 3/2019 | Ali et al. | |
| 2019/0135199 A1 | 5/2019 | Galan Garcia et al. | |
| 2020/0192423 A1 | 6/2020 | Hsu et al. | |

FOREIGN PATENT DOCUMENTS

| | | |
|---|---|---|
| CN | 1978671 A | 6/2007 |
| CN | 201405914 | 2/2010 |
| CN | 202010160 U | 10/2011 |
| CN | 202138313 | 2/2012 |
| CN | 202765080 | 3/2013 |
| CN | 103618389 | 3/2014 |
| CN | 105196867 | 12/2015 |
| CN | 204926416 | 12/2015 |
| CN | 105507015 | 4/2016 |
| CN | 105951471 | 9/2016 |
| CN | 106663524 | 5/2017 |
| CN | 206948003 U | 1/2018 |
| DE | 2026892 | 12/1971 |
| DE | 102010053354 | 8/2011 |
| DE | 202012004803 | 6/2012 |
| DE | 202013005923 | 7/2013 |
| DE | 202015001403 | 7/2015 |
| DE | 102015200264 | 7/2016 |
| DE | 102015200272 | 7/2016 |
| DE | 102016122074 | 5/2017 |
| DE | 102016202013 | 8/2017 |
| EP | 1580080 | 9/2005 |
| EP | 2628627 | 8/2013 |
| FR | 2937932 | 5/2010 |
| GB | 1313537 | 4/1973 |
| JP | 2000500101 | 1/2000 |
| JP | 2008254485 | 10/2008 |
| JP | 2009018747 | 1/2009 |
| JP | 2009045077 | 3/2009 |
| JP | 2009119230 | 6/2009 |
| JP | 2009527377 | 7/2009 |
| JP | 2009292167 | 12/2009 |
| JP | 201061959 | 3/2010 |
| JP | 2013177714 | 9/2013 |
| JP | 2014015145 | 1/2014 |
| JP | 2015054564 | 3/2015 |
| JP | 2016510286 | 4/2016 |
| JP | 2016073196 | 5/2016 |
| JP | 201722956 | 1/2017 |
| KR | 20100129652 | 12/2010 |
| KR | 20120001064 | 2/2012 |
| KR | 20140110321 | 9/2014 |
| KR | 20150061894 | 6/2015 |
| KR | 20160089299 | 7/2016 |
| KR | 20180060758 | 6/2018 |
| TW | 201809286 | 3/2018 |
| WO | WO2002103718 | 12/2002 |
| WO | WO2007038950 | 4/2007 |
| WO | WO2011006641 | 1/2011 |
| WO | WO2011012225 | 2/2011 |
| WO | WO2014110323 | 7/2014 |
| WO | WO2015103563 | 7/2015 |
| WO | WO2015103565 | 7/2015 |
| WO | WO2015151595 | 10/2015 |
| WO | WO2016057487 | 4/2016 |
| WO | WO2016170160 | 10/2016 |
| WO | WO2016198969 | 12/2016 |
| WO | WO2017/003531 | 1/2017 |
| WO | WO2017055685 | 4/2017 |
| WO | WO2017120050 | 7/2017 |
| WO | WO2015001665 | 1/2018 |
| WO | WO2018032026 | 2/2018 |

OTHER PUBLICATIONS

Office Action of U.S. Appl. No. 15/635,803 dated Jun. 24, 2021, 28 pages.

European Office Action of EP19219164.1 dated Feb. 18, 2022, 7 pages.

Notice of Allowance of U.S. Appl. No. 16/696,833 dated Sep. 16, 2021, 8 pages.

Office Action of U.S. Appl. No. 15/635,803 dated Aug. 18, 2022, 29 pages.

Office Action of U.S. Appl. No. 15/635,803 dated Dec. 9, 2021, 22 pages.

Afzali, A. and SH Maghsoodlou; "Nanostructured Polymer Blends and Composites in Textiles", Nanostructured Polymer Blends and Composites in Textiles (2016): 58. https://books.google.com/books?hl=en&lr=&id=upXwCgAAQBAJ&oi=fnd&pg=PA41&dq=leather+smart_material+OR +intelligent_material++vehicle+OR+automotive+OR+automobile+OR+car+OR+driver+illuminate+OR+color +&ots=EtKF9oClou&sig=dFB_31AgXvteP7vqBtI5R6_Isql#v=onepage&q&f=false.

Cooper, Tyler; "Wireless Inductive Power Night Light." Adafruit. https://learn.adafruit.com/wireless-inductive-power-night-light?view=all.

CSIR—Central Leather Research Institute, "A novel bi-functional leather for smart product applications and a process for the preparation thereof" https://www.clri.org/Patents.aspx?P=22.

Davis, Alex; "Faurecia's Self-Driving Car Seat Knows When You Need a Massage", WIRED; Transportation, Nov. 17, 2015 https://www.wired.com/2015/11/faurecias-self-driving-car-seat-knows-when-you-need-a-massage/.

Wegene Jima Demisie, Thanikaivelan Palanisamy, Krishnaraj Kaliappa, Phebe Kavati, Chandrasekaran Bangaru; "Concurrent genesis of color and electrical conductivity in leathers through in-situ polym-

(56) References Cited

OTHER PUBLICATIONS erization of aniline for smart product applications", Feb. 28, 2015 https://onlinelibrary.wiley.com/doi/abs/10.1002/pat.3483.
M. F. Farooqui and A. Shamim; "Dual band inkjet printed bow-tie slot antenna on leather", 2013 7th European Conference on Antennas and Propagation (EuCAP), Gothenburg, 2013, pp. 3287-3290. IEEE Xplorer.
Fukuyama et al.; "Multi-Layered Fabric Electrode for Movement Artifact Reduction in Capacitive ECG Measurement", Conf Proc IEEE Eng Med Biol Soc. 2013;2013:555-8.
S. Griffiths; Daily Mail.com, Sep. 23, 2015, "The smart car seat that tackles Road Rage: Chair gives drivers a relaxing massage or a blast of air to focus their attention" https://www.dailymail.co.uk/sciencetech/article-3246341/The-smart-car-seat-tackles-ROAD-RAGE-Chair-gives-drivers- relaxing-massage-blast-air-focus-attention.html.
Heuer et al.; "Unobtrusive In-Vehicle Biosignal Instrumentation for Advanced Driver Assistance and Active Safety", 2010 IEEE Embs Conference on Biomedical Engineering and Sciences (IECBES) Nov.30-Dec. 2, 2010.
J. Hoefler, B. Hageman, E. Nungesser and R. Smith, "High-performance acrylic polymer technology", Leather International, Apr. 22, 2016.
Kindermann, "Automotive—Leather innovation from Wollsdorf—Smart Leather", Mar. 26, 2019, 2 pages.
Rao, S.; "High-definition haptics: Feel the difference!" Texas Instruments Incorporated, Analog Applications Journal 3Q 2012, 6 pages.
Sangeetha et al.; "Stimuli Responsive Leathers Using Smart Retanning Agents", JALCA, vol. 107, 2012.
TDK Group Company, Piezo Haptic Actuator—POwerHapTM, 15G Type, Preliminary data, Jun. 9, 2017, 9 pages.
Wang et al.; "Wireless Power Transfer System in the LED Lighting Application." 2015 12th China International Forum on Solid State Lighting (2015): 120-122.
Wollsdorf Leather, "MEDICAL—Durability for Special applications indoors and outdoors", 2 pages.
Wollsdorf Leder "Wollsdorf Leder in the interior space", 4 pages, https://www.wollsdorf.com/w/en/products/upholstery/services/leder/.
J. Zaklit, Y. Wang, Y. Shen and N. Xi; "Quantitatively characterizing automotive interior surfaces using an Optical TIR-based texture sensor", 2009 IEEE International Conference on Robotics and Biomimetics (ROBIO), Guilin, 2009, pp. 1721-1726., doi: 10.1109/ROBIO.2009.5420440, IEEE Xplore.
Office Action of U.S. Appl. No. 16/696,833 dated Jun. 8, 2021, 36 pages.
International Search Report and Written Opinion of Serial No. PCT/US2018/031583 dated Jul. 20, 2018, 10 pages.
International Search Report and Written Opinion of Serial No. PCT/US2018/031803 dated Jul. 20, 2018, 11 pages.
International Search Report and Written Opinion of Serial No. PCT/US2018/032358 dated Jun. 21, 2018, 10 pages.
International Search Report and Written Opinion of Serial No. PCT/US2019/030130 dated Aug. 30, 2019, 33 pages.
International Search Report and Written Opinion of Serial No. PCT/US2020/023281 dated Jun. 8, 2020, 17 pages.
Extended European Search Report of EP18822996.7 dated Jan. 14, 2021, 8 pages.
Extended European Search Report of EP18823412.4 dated Feb. 26, 2021, 10 pages.
Extended European Search Report of EP18825366.0 dated Mar. 2, 2021, 8 pages.
Extended European Search Report of EP19219164.1 dated Jun. 4, 2020, 13 pages.
Extended European Search Report of EP19797012.2 dated Jan. 20, 2022, 9 pages.
Notice of Allowance of U.S. Appl. No. 15/635,803 dated Jan. 17, 2023, 9 pages.
Office Action of U.S. Appl. No. 16/821,568 dated Nov. 7, 2022, 26 pages.
Notice of Allowance of U.S. Appl. No. 16/821,568 dated May 5, 2023, 16 pages.

\* cited by examiner

EMBOSSED SMART FUNCTIONAL PREMIUM NATURAL LEATHER

CROSS REFERENCE TO RELATED APPLICATION

This application is a continuation application of U.S. application Ser. No. 16/857,548, filed Apr. 24, 2020; which itself is a continuation of U.S. application Ser. No. 16/185,633, filed Nov. 9, 2018; which itself claims priority to U.S. Provisional Patent Application Ser. No. 62/667,178 filed May 4, 2018; and is a continuation-in-part application of U.S. application Ser. No. 15/635,803 filed Jun. 28, 2017; is a continuation-in-part application of U.S. application Ser. No. 15/635,838 filed Jun. 28, 2017; and is a continuation-in-part application of U.S. application Ser. No. 15/635,862 filed Jun. 28, 2017; all of which are expressly incorporated herein by reference.

BACKGROUND

Interior vehicle components often include a surface layer of premium natural leather. The leather is wrapped around and secured to an underlying structure. The leather is pliable, and thus conforms to the contours of the underlying structure. In luxury vehicles, leather is generally applied as a surface layer over components that may come in direct contact with occupants of the vehicle, such as interior panels, seats, and door linings. The main function of the leather is for aesthetics and to provide a luxurious look to the interior of the vehicle. However, natural leather offers no functionality to the vehicle components. Accordingly, there is a need for an improved surface layer for vehicle components.

BRIEF DESCRIPTION

According to one aspect, a method of producing an embossed functional leather assembly includes preparing a functional leather assembly, which includes providing a leather substrate comprising a first side and a second side opposite from the first side; and applying a flexible conductive trace over the first side of the leather substrate. The functional leather assembly is embossed to provide an embossed texture at the first side of the functional leather substrate.

According to another aspect, a method of producing an embossed functional leather assembly includes providing a leather substrate comprising a first side and a second side opposite from the first side; arranging a pigmented coating on the first side of the leather substrate; applying a flexible conductive trace over the pigmented coating on the first side of the leather substrate; optionally applying a topcoat over the flexible conductive trace; and embossing the resulting assembly to provide an embossed texture at the first side of the functional leather substrate.

According to another aspect, a method of producing an embossed functional leather assembly includes preparing a functional leather assembly, which includes providing a leather substrate comprising a first side and a second side opposite from the first side; applying a flexible conductive trace over the first side of the leather substrate; and arranging a pigmented coating on the first side of the leather substrate to thereby cover the trace. The functional leather assembly is embossed to provide an embossed texture at the first side of the functional leather substrate.

According to another aspect, method of producing a functional vehicle component includes preparing a functional leather assembly by applying an electronic circuit, including a flexible conductive trace, to a first side of a leather substrate. The functional leather assembly is embossed to provide an embossed texture at the first side of the functional leather substrate, and the functional leather assembly is arranged to cover a surface of a vehicle component such that the first side of the leather substrate faces away from the vehicle component.

According to another aspect, method of producing a functional vehicle component includes preparing a functional leather assembly by applying an electronic circuit, including a flexible conductive trace, to a first side of a leather substrate; arranging a pigmented coating on the first side of the leather substrate to thereby cover the circuit; and applying an anti-soiling layer to the pigmented coating. The functional leather assembly is embossed to provide an embossed texture at the first side of the functional leather substrate, and the functional leather assembly is arranged to cover a surface of a vehicle component such that the first side of the leather substrate faces away from the vehicle component.

According to another aspect, a functional vehicle component comprises a functional leather assembly. The functional leather assembly includes a leather substrate comprising a first side and a second side opposite from the first side, and a flexible electrically conductive trace arranged on the first side of the leather substrate. The functional leather assembly is embossed with an embossed texture at the first side of the leather substrate.

According to another aspect, a functional vehicle component comprises a functional leather assembly. The functional leather assembly includes a leather substrate comprising a first side and a second side opposite from the first side, a flexible electrically conductive trace arranged on the first side of the leather substrate, and a pigmented coating on the first side of the leather substrate and covering the trace. The functional leather assembly is embossed with an embossed texture at the first side of the leather substrate.

DETAILED DESCRIPTION

Figure 1:
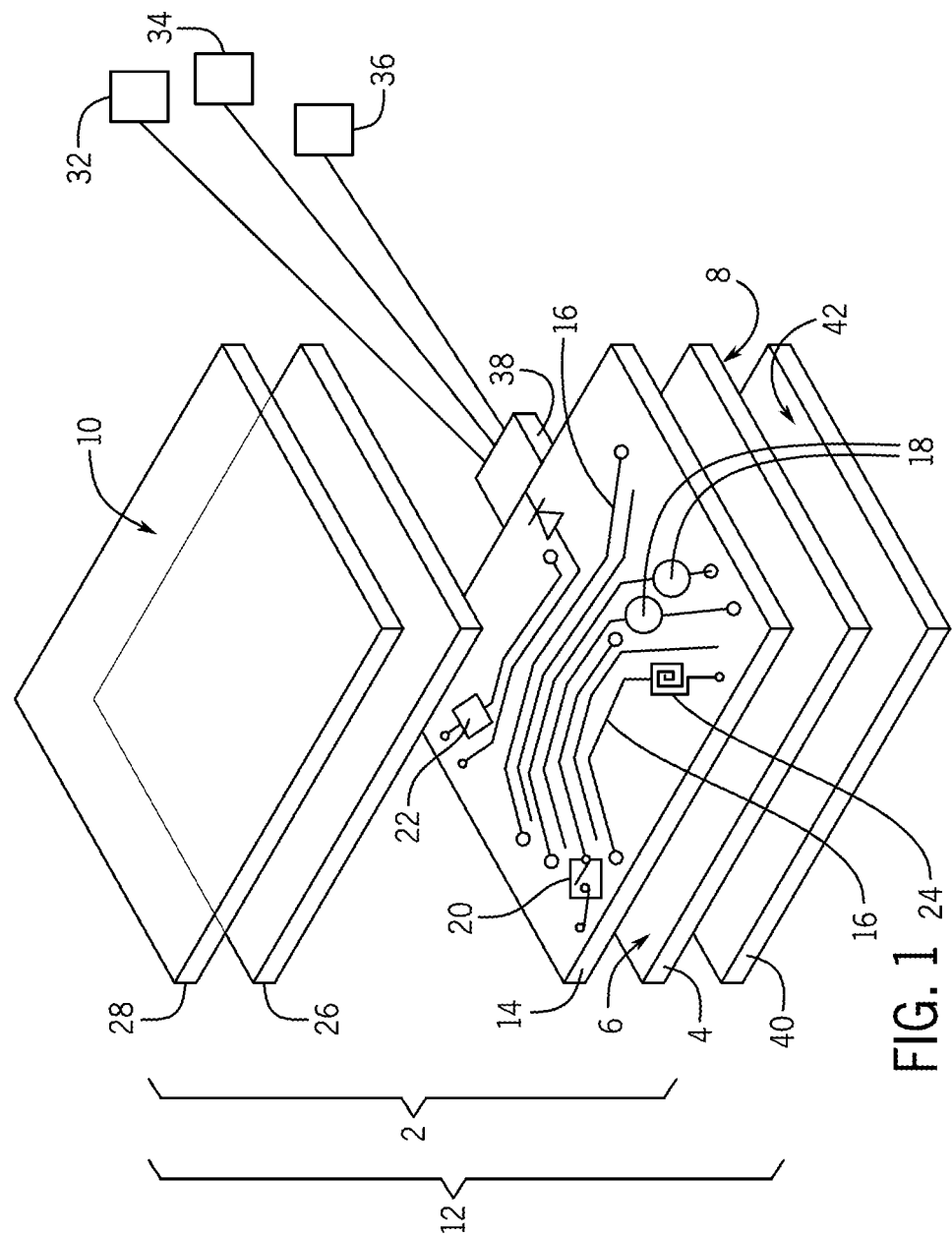
FIG. 1 is a schematic perspective exploded view of a smart functional vehicle component includes a smart functional leather assembly according to the present subject matter.

Smart functional vehicle components can be used to make an occupant's experience in the vehicle more comfortable and enjoyable as compared to non-functional vehicle components.

The present subject matter provides a smart functional leather assembly that is flexible, and therefore can be wrapped around or over various vehicle components to make the vehicle components smart and functional. The smart functional leather assembly can be arranged on an interior or exterior of a vehicle. The outermost surface of the smart functional leather assembly presents a clean finish to a vehicle component, and therefore has an uncluttered appearance despite having a smart functional capacity.

The present subject matter includes a smart functional leather assembly, and a method of making a leather substrate to be smart and functional, as opposed to being used for only aesthetic purposes, without cluttering the appearance of the leather substrate. For this purpose, the smart functional leather assembly may include electronic elements including for example, traces, switches (e.g. actuator buttons), sensors, or other functional or smart elements on a first side of the leather substrate. When used in an interior of a vehicle, the functional leather assembly can provide a dynamic interior experience for occupants of a vehicle, yet provide a smart functional vehicle component that has an uncluttered appearance.

Referring now to the figures, where the depictions are for purposes of illustrating one or more embodiments only and not for purposes of limiting the same, the present subject matter includes a smart functional leather assembly 2 (also referred to herein as "functional leather assembly" or "leather assembly"). As depicted, the functional leather assembly 2 includes a leather substrate 4, an electronic circuit layer 14, a pigmented coating 26, and an optional anti-soiling layer 28.

The leather substrate 4 may be in the form of a leather sheet, including a first side 6 and a second side 8 opposite from the first side 6. The first side 6 of the leather substrate 4 may face the same direction as an A-surface 10 of the functional leather assembly 2 (see FIG. 5). As used herein, "A-surface" refers to the outermost surface of the leather assembly 2 that is most visible to (i.e. most facing) vehicle occupants after the functional leather assembly 2 including the leather substrate 4 is arranged in a vehicle; while a B-surface, a C-surface, a D-surface, etc. are other surfaces of the leather substrate 4 that are progressively less visible than the A-surface 10. When arranged on a vehicle component 40 to produce a smart functional vehicle component 12 (FIG. 5), the A-surface 10 of the functional leather assembly 2 is facing the vehicle occupants and unless covered by another layer or feature, may be visible to the occupants of the vehicle. The A-surface 14 may be what is referred to in the leather industry as the grain side, the skin side, the top side, or the hair side of the leather sheet 10. The grain side, the skin side, the top side, or the hair side is the side of the leather sheet 10 opposite from what is referred to in the leather industry as the flesh side or back side of the leather sheet 10. The flesh side is the side of the leather sheet 10 that is connected to the meat of the animal from which the leather sheet 10 is taken.

The leather substrate 4 may be processed from natural animal hide, or may include composite leather (e.g. bonded leather) or synthetic leather products. When natural animal hide is used as the leather substrate, the animal hide may be subject to a leather preparation processes including one or more of tanning, soaking, sammying, shaving, fleshing/splitting, drying, staking, milling, and drying. Then, after application of a base coat, the hide may be cut into a desired shape for a particular application, for example to cover a seat, interior panel, steering wheel, or other vehicle component 40 in a vehicle to form the smart functional vehicle component 12. The hide may be cut or formed to a particular size or shape to correspond to the shape and size of the vehicle component 40 on which it will be arranged. The natural animal hide may be replaced or supplemented with bonded leather, synthetic leather, other leather composite material, or other material or layers as desired. In accordance with the present subject matter, the leather substrate 4 may have a shape and size that is configured to wrap around or over a surface 42 of an interior panel, a door, a seat (FIG. 5), a steering wheel, a dashboard, a center console, or a gear shifter for example.

After the leather substrate 4 is prepared as desired, the electronic circuit layer 14, pigmented coating 26, and optional anti-soiling layer 28 may be applied to the leather substrate 4 to form a leather assembly 2. In one embodiment, the electronic circuit layer 14, pigmented coating 26, and optional anti-soiling layer 28 allow some characteristics (e.g. surface texture or grain, and softness) of the leather substrate 4 to be at least partially perceived by occupants of the vehicle, such as by touch or sight.

The electronic circuit layer 14 (also referred to herein as "circuit layer" or "circuit") is flexible, and is arranged on the first side 6 of the leather substrate 4, optionally in direct contact with the first side 6 of the leather substrate 4 or having one or more intervening layers arranged therebetween. The circuit 14 includes one or more flexible electrically conductive traces 16 (also referred to herein as "flexible conductive traces," "conductive traces," or "traces"). As used herein, "electrically conductive" or "conductive" refers to a material or structure that can transmit an electric current or signal. By "flexible", it is meant a layer, circuit, trace or other element or material that is not rigid, brittle, or stiff, and instead bends, stretches, changes shape, or otherwise yields to external forces, yet does not break or lose functionality when subject to such external forces. When referring to a "flexible electronic circuit" or "flexible conductive trace", it is meant that the electronic circuit 14 and trace 16 retrain their electrical conductivity even when bent, stretched, twisted or otherwise deformed to a strain of 10% to at least 20%. In one embodiment, the circuit 14 and traces 16 do not break when so deformed.

The circuit 14 optionally includes one or more electronic elements (e.g. light sources 18, switches 20, sensors 22, wireless transmitters 24, resistors, capacitors, wires, diodes, transistors, inductors, power sources, transformers, fuses, antennas, or the like, each of which may be flexible) that are in electrical communication with the traces 16. In an alternative embodiment, these electronic elements of the circuit 14 may be arranged elsewhere other than as part of the circuit 14, but still in electrical communication with the conductive traces 16. The circuit 14 is arranged on the first side 6 of the leather substrate 4 in order to provide functionality to the leather substrate 4.

Figure 2:
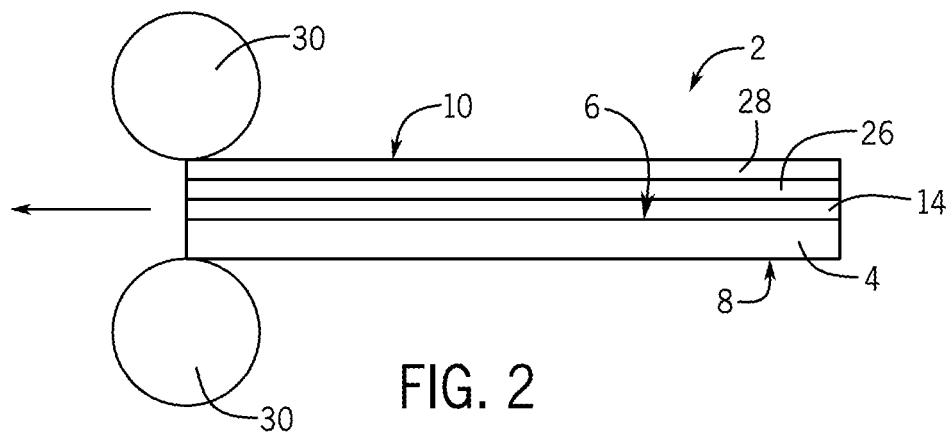
FIG. 2 is a schematic view a smart functional leather assembly being embossed according to the present subject matter.

Although the circuit 14 is depicted in FIGS. 1 and 2 as a continuous layer, this is done for convenience in order to show the arrangement of the various components of the smart functional leather assembly 2, and it should be understood that the circuit 14 may not be a continuous layer, but instead may include the traces 16 that are applied directly to the leather substrate 4 and therefore include one or more gaps between the traces 16 and the one or more optional electronic components of the circuit 14. However, the circuit 14 may be a continuous layer as depicted, such as for example, the circuit 14 may be formed on a surface of a film, and the film carrying the circuit 14 may be applied directly to the leather substrate 4.

The circuit layer 14 may comprise one or more electrically isolated circuits. In one embodiment, the circuit layer 14 includes only one electronic circuit. In another embodiment, the circuit layer 14 includes more than one electronic circuit, for example, two, three or more electronic circuits. When more than one circuit is included in the circuit layer 14, each individual circuit may each be configured to perform a different function than the other circuits, which may mean that each circuit is electrically isolated/separated from the other circuits, or the circuits can be independently operated, or each circuit can function separately from the other circuits, or the circuits are electrically connected to different types of electronic elements of the circuit layer 14.

The circuit 14 includes at least one flexible conductive trace 16. Further, as will be understood, the figures only schematically depict the traces 16, and are not meant to restrict the traces 16 to be in any particular arrangement. In one non-limiting embodiment, the circuit 14 contacts the first side 6 of the leather substrate 4. In another embodiment, the circuit 14 is arranged on a polymer film, which is then arranged on the first side 6 of the leather substrate 4.

The conductive traces 16 and electronic components may each be formed using an electrically conductive ink that includes a binder (e.g. polymer material such as polyimide) and conductive particles, including for example, copper, silver, carbon, silver chloride, or other electrically conductive particles. Optionally, the one or more optional electronic elements of the circuit 14 can comprise prefabricated units that are electrically connected to the traces 16 by using a conductive adhesive for example.

The one or more conductive traces 16 and optional electronic elements of the circuit 14 may each be formed by applying, e.g. printing, a conductive ink directly on the first side 6 of the leather substrate 4, followed by curing, drying, hardening, etc. of the conductive ink to thereby form the conductive traces 16, and electronic elements of the circuit 14. In other words, the conductive traces 16 and electronic elements of the circuit 14 may be defined by, or include a printed and cured conductive ink. Conductive inks that are suitable to create the one or more traces and electronic elements of the circuit 14 are not particularly limited, and may include conductive metal (e.g. silver) or other particles, and can include for example, PE671, PE773, PE873, and PE971 Stretchable Conductors, PE410 Ink-Jet Silver Conductor, 5021, 5025, 5028, and 5064HY Ag Conductors, ME601 and ME602 Stretchable Silver Conductors, PE827 and PE828 Ultra-Low Temperature Cure Silver Composite Conductors, Kapton™ KA801 Polyimide Silver Conductor, available from E. I. du Pont de Nemours and Company; and CI-1036, CI-4040, CI-2051, and CI-1062 Stretchable Conductive Ink available from Engineered Materials Systems, Inc. (EMS).

These conductive inks can be applied directly on the first side 6 of the leather substrate 4, or on a film that is to be arranged on the first side 6 of the leather substrate 4. The conductive ink can be applied by any method including pad-printing, flexography, rotogravure, spraying, dipping, syringe dispensing, stenciling, screen printing, aerosol jet printing, or inkjet printing for example in order to create an electronic circuit. The flexible electrically conductive traces 16 can be formed using other materials or processes including etching, in-mold forming of the electronic circuits, selective photocuring, and circuit scribe, for example. In one illustrative embodiment, the one or more conductive traces 16 are formed by screen printing a conductive ink on the first side 6 of the leather substrate 4.

In one non-limiting example, one or more light sources 18 are included as an electronic element in the functional leather assembly 2. The light sources 18 may comprise for example, a light emitting diode (LED), an electroluminescent light source, or other light source. The light sources 18 emit light when activated, and are electrically connected to the circuit 14. The light sources 18 may simply provide illumination by emitting light, which may be used to provide illumination to the interior or exterior of the vehicle, and the light sources 18 may emit light in one or more colors and/or intensities. The light sources 18 may be paired to certain functions of the vehicle or vehicle components, such that the light sources 18 operate to emit light at different intensities and/or colors depending on certain circumstances such as during normal operation of the vehicle, during operation of a vehicle entertainment system, during dangerous operation of the vehicle, or other circumstances or situations as desired.

The light source 18 may be configured, such as by arrangement or operation, to emit light that provides visual indicators that convey information to a vehicle occupant. In other words, the light source 18 may be arranged, or may emit light in such a way that the light emitted by the light source 18 provides more than mere illumination, and instead additionally conveys information to a vehicle occupant. The visual indicators provided by the light source 18 may correspond to signals or data derived from the electronic systems of a vehicle or the HMI 34. The visual indicators provided by the light source 18 are not particularly limited by the present disclosure, and may provide information such as warnings, notices (e.g. the time), alerts, instructions, information relating to a current condition or situation relating to the vehicle or vehicle components, an occupant of the vehicle, or an environment of the vehicle including an immediate surrounding environment of the vehicle, and combinations thereof.

The light emitted by the light source 18 may indicate a location of the circuit 14 or the location of the various electronic elements of the circuit 14. The light source 18 may also be activated to emit light when a certain associated object is within a predetermined distance from the functional leather assembly 2. For example, the light source 18 may be activated to emit light when a portable electronic device or vehicle occupant is within a predetermined distance from the functional leather assembly 2.

The light source 18 is not limited in any way and can include luminescent light sources (e.g. electroluminescent, photoluminescent, mechanoluminescent light sources), and incandescent light sources. Illustrative examples of the light source 18 include a light emitting diode (LED), an organic light emitting diode (OLED), or a photoluminescent or electroluminescent light source configured in a film or sheet. In a non-limiting example, the light source 18 comprises LED's having a light emitting area with a size of 100 μm×100 μm (i.e. 100 μm diameter) or less, herein referred to micro LED's. A micro LED comprises of an array of one or more individual light emitters, where an array may have a diameter of about 2 μm-20 mm and the individual light emitters have typical diameters of about 2-20 μm. In one aspect, the one or more micro LED's are arranged as part of the circuit 14.

One or more sensors 22 may be included as part of the circuit 14. The sensors 22 are not particularly limited, and can include a sensor having any configuration including those that can sense pressure, temperature, proximity, location, speed, velocity, acceleration, tilt, motion, humidity, light, biometrics of a vehicle occupant, etc. In one embodiment, the circuit 14 includes one or more pressure sensors.

As described herein, a switch 20 may be included in the electronic circuit 14. The switch 20 may be operable to make or break a conductive path in the circuit 14 in order to activate a particular function of the circuit 14, the electronic elements of the circuit 14, or a vehicle system or component. The switch 20 may be a parallel plate capacitive switch for example, or other type of switch as desired such as a membrane switch. The switch may define a button that can be actuate by an occupant of the vehicle making contact with the switch.

The leather assembly 2 also includes a pigmented coating 26 arranged on the circuit 14 to at least partially conceal the circuit 14, or on the first side 6 of the leather substrate 4 between the leather substrate 4 and the circuit 14. The pigmented coating 26 may be arranged directly in contact with the circuit 14 or may be arranged with one or more intervening layers therebetween. In an embodiment, the pigmented coating 26 is not included, or the pigmented coating 26 may be clear (i.e. optically transparent) and/or the circuit 14 and electronic elements thereof may be positioned on top of the pigmented coating 26. The pigmented coating 26 is not particularly limited by the present subject matter, and may include one or more translucent layers, films, or coatings arranged on the flexible circuit 14. By "translucent" it is meant material(s) or a layer(s) that allows light to pass therethrough, but causes sufficient diffusion to prevent perception of distinct images through the material or layer. In accordance with the present subject matter, the pigmented coating 26 may produce sufficient diffusion of light such that visibility through the pigmented coating 26 of the flexible electronic circuit 14 and all the electronic elements of the circuit 14, except for light emitted by the light source 18, is inhibited or prevented by the pigmented coating 26. In one embodiment, the flexible electronic circuit 14 and all the electronic elements of the circuit 14 are camouflaged by the pigmented coating 26. In a non-limiting example, the flexible electronic circuit 14 and all the electronic elements of the circuit 14 are not visible through the coating 26

Visibility of the light source 18 through the pigmented coating 26 is optionally inhibited by the pigmented coating 26 so that the light source 18 is camouflaged by the pigmented coating 26. However, the pigmented coating 26 may be sufficiently translucent (rather than being completely opaque) such that when the light source 18 is activated to emit light, the light emitted by the light source 18 is visible through the pigmented coating 26. Accordingly, the pigmented coating 26 at least in some measure may conceal the flexible circuit 14 (including the light source 18) from view, yet allows light emitted from the light source 18 to be transmitted therethrough so that the emitted light is visible through the pigmented coating 26 and can be seen. Light emitted from the light source 18 that is transmitted through the pigmented coating 26 may be seen for example, by a vehicle occupant, and can be used for vehicle illumination or as visual indicators to convey information to a vehicle occupant.

The pigmented coating 26 may include a polymer, textiles, composite materials, enamels, paper, glass, metal, ceramic, other material, and combinations thereof. In one non-limiting example, the pigmented coating 26 comprises one or more layers, each including for example, a mixture of polymer and pigment particles. The polymer may be an acrylic urethane resin for example. The pigmented coating 26 may be formed by applying one or more coatings of the polymer/pigment mixture as a liquid over the flexible circuit 14 and curing the polymer to produce the pigmented coating 26 as a solid layer covering the circuit 14. The pigmented coating 26 may have a pigment loading and thickness sufficient to inhibit or prevent the circuit 14 and the electronic elements of the circuit 14, including the light source 18, from being visible through the pigmented coating 26. However, the pigmented coating 26 is sufficiently translucent, as opposed to being completely opaque, such that light emitted by the light source 18 can be seen through the pigmented coating 26. In one non-limiting embodiment, the pigmented coating 26 has a thickness from 5-50 µm, 15-40 µm, or 20-30 µm. Other thicknesses can be used.

In one embodiment for example, the pigmented coating 26 includes a multi-layer structure including a 20-45 microns thick base color layer that is applied wet on the leather substrate 4 and dried at about 100° C. for one minute; a 15-20 micron thick color coat is then applied wet and dried at 100° C. for one minute; and then three layers of topcoat each at 5-20 microns thick (for a total of 15-60 microns thickness) are applied wet and then dried at 100° C. for one minute. The base color layer, the color coat, and the topcoat layers may each be applied by spraying and each may comprise a polyurethane acrylic dispersion with pigment. The base color layer and color coat are included to provide abrasion resistance and color consistency. The topcoat is provided for haptics and color performance. The leather substrate may also be coated initially with a base coat of polyurethane and acrylic dispersion, applied by a roller, and included to provide adhesion to the leather substrate 4.

The leather assembly 2 optionally includes an anti-soiling layer 28 arranged on the pigmented coating 26. The anti-soiling layer 28 includes an anti-soiling component for inhibiting the aggregation of soil, dirt, stains or other debris on the leather assembly 2. In one non-limiting embodiment, the anti-soiling layer 28 includes a polymer carrier that is applied at 1-10 microns thick and then dried at 100° C. for one minute to form a coating on the leather assembly 2. Other carriers, thicknesses, and drying times and temperatures may be used. In an alternative embodiment, the functional leather assembly 2 may not include a separate and distinct anti-soiling layer 28, and can instead include an anti-soiling component as part of the pigmented coating 26.

The anti-soiling layer 28, or an anti-soiling component included in the pigmented coating 26, may present an exposed outermost surface (i.e. A-surface 10) of the functional leather assembly 2, and these are optionally included to resist any type of dirt accumulation on the leather assembly 2 while possibly retaining at least some physical and aesthetical properties of the underlying layers of the functional leather assembly 2. The anti-soiling layer 28 is not particularly limited by the present subject matter, and may be included as a distinct layer as depicted in FIGS. 1 and 2. Alternatively, an anti-soiling component may be included as part of the pigmented coating 26. In a non-limiting embodiment as depicted in FIG. 1, when included as a distinct layer in the functional leather assembly 2, the anti-soiling layer 28 may be essentially transparent (and may be optically transparent) such that the anti-soiling layer 28 does not significantly interfere with the transmission of light emitted by the light source 18 or affect the aesthetics of the pigmented coating 26. In another embodiment, the anti-soiling layer 28 may be pigmented such that it assists the pigmented coating 26 in concealing the circuit 14 from view. In one non-limiting embodiment, the anti-soiling layer 28 has a thickness from 0.1-10 µm, 1-8 µm, or 4-6 µm.

The anti-soiling component included in the anti-soiling layer 28 or in the pigmented coating 26, is not particularly limited and may comprise acrylic urethane resin, polyurethane resin, polyisocyanate, carbodiimide, fluorine-containing materials such as tetrafluoroethylene (TFE)-copolymers, silicone, etc.

The functional leather assembly 2 can include various other layers or components as desired. In one embodiment and although not shown in the figures, the functional leather assembly 2 includes a dielectric layer over or between one or more conductive traces 16 or conductive traces 16 of the circuit 14. The dielectric material may generally include a non-conductive resin cured to form a dielectric layer. In one embodiment, a dielectric layer is arranged between the circuit 14 and the pigmented coating 26 in order to avoid moisture exposure during formation of the pigmented coating 26, or to make the circuit 14 more durable and resistant to abrasion and therefore maintain electrical conductivity after repeated use. A dielectric layer or coating may also be used as an insulator, for example, to provide electrical insulation between a first trace or circuit and an overlying second trace or circuit.

The dielectric layer may cover only the trace or circuit, or may also generally cover other portions of the circuit 14 or leather substrate 4. That is, the dielectric layer may be generally applied over the first circuit as one continuous layer, where the conductive traces of the first circuit and spaces therebetween are covered by the dielectric layer, or may be applied as a discontinuous layer that covers only the conductive traces of the first circuit, but not the spaces therebetween. In one non-limiting example, the dielectric layer is applied only at a location where a second trace or circuit overlaps the first trace or circuit. In this regard, the circuit 14 may include a plurality of separate and distinct traces 16 that may be arranged in different planes or sub-layers of the circuit layer 14, where various conductive traces 16 may overlap each other. For example, with reference to FIGS. 1 and 5, although the traces 16 are depicted as not overlapping (and appear to be in the same plane or sub-layer), the traces 16 may be in different planes within the circuit layer 14 and be configured to overlap each other. As such, the circuit 14 may include a first trace printed on the leather substrate 4, followed by a dielectric layer applied over the first trace, and then a second trace printed on the leather substrate 4 and at least partially overlapping the first trace, yet because of the intermediary dielectric layer, the first and second trace are electrically isolated form one another. As such, the present subject matter is not limited to any particular shape or orientation of the traces 16 and electronic elements of the circuit 14 as depicted in the various figures, and instead can have other arrangements and orientations. In another example, a conductive ink is first printed directly on the leather substrate 4 in order to form a wireless transmitter 24, a dielectric layer is then arranged over the wireless transmitter 24, then a conductive ink is printed over the dielectric layer (or overlaps a portion of it) in order to form a separate conductive trace for a different electronic element (e.g., for a light source 18), and then optionally another dielectric layer is printed over the light source trace to provide abrasion resistance for the underlying layers. In this example, the dielectric layer between the wireless transmitter 24 and the light source trace electrically isolate the wireless transmitter 24 from the light source trace.

The entire leather assembly 2 is embossed as depicted in FIG. 2, to provide an embossed texture at the A-surface 10 of the leather assembly 2. The functionality of the circuit 14 is not destroyed by embossing. In other words, electrical conductivity of the conductive traces 16 is not broken by embossing the functional leather assembly 2 and the optional electronic elements of the circuit 14 are still functional after embossing. The circuit 14 is therefore able to perform electronic operations even after embossing the leather assembly 2.

Embossment of the leather assembly 2 can comprise roll-to-roll heated embossment accomplished by processing the leather assembly 2 through heated embossing rollers 30, 30 to impart the embossed texture at the first side 6 of the leather substrate 4. Roll-to-roll heated embossment can comprise embossment at conditions of 80-100° C., 20-30 Bar, and dwell speed of 2.5-4.5 to apply natural leather grain embossment pattern to the A-surface 10 of the functional leather assembly 2. Embossment of the leather assembly 2 can comprise other methods, including roll-to-plate, roll-to-die, stamping, clamping, punching, pressing, and the use of various embossing rollers, embossing dies, embossing stamps, or other embossing tools. The embossed texture is not particularly limited, and may include leather grain, dimples or other textures, patterns, indicia, or a combination thereof. The leather grain texture can include reproductions of various animal grains, including cow, snake, crocodile, other animals, and variations and combinations thereof. Through applying different types of embossment, the smart functional leather assembly 2 can have different types of aesthetic appearances and feel, while maintaining functionality imparted by the circuit 14.

The embossed texture is applied directly to the A-surface 10 of the leather assembly 2 and over the circuit 14, for example as depicted in FIG. 2. The embossing parameters (e.g. the pressure applied to the leather assembly 2 by the embossing rollers 30, 30, the dwell time of the leather assembly 2 between the embossing rollers 30, 30, and the temperature of the embossing rollers 30, 30) and parameters of the various components of the leather assembly 2 (including for example, the thicknesses and compositions of the leather substrate 4, the circuit 14, the pigmented coating 26, and the anti-soiling layer 28) a can be tailored to avoid the functionality of the circuit 14 from being eliminated by the embossment. In one embodiment, the functionality of the circuit 14 is not eliminated by the embossment process, such that the electrical conductivity of the conductive traces 16 is not broken and the functionality of the other electronic components is not eliminated by embossing of the functional leather assembly 2. The functionality of the circuit 14, including the conductive traces 16 and electronic components, can be assessed after embossing the functional leather assembly 2.

The functional leather assembly 2 can be arranged to a vehicle component 40 to form a smart functional vehicle component 12 (also referred to herein as "functional vehicle component"). The embossed functional leather assembly 2 may be included on any vehicle component 40 as desired, for example on any surface 42 of an interior or exterior vehicle component 40, such as a vehicle seat (FIG. 5), dashboard, or center console for example.

The functional vehicle component 12 is not particularly limited by the present subject matter, and may comprise any interior functional vehicle component such as an interior panel, a door, a seat (FIG. 5), a steering wheel, a dashboard, a center console, a gear shifter or any other interior component that can be wrapped, covered, or coated with the embossed functional leather assembly 2. Optionally, the functional vehicle component 12 can include an exterior functional vehicle component. The embossed functional leather assembly 2 can be arranged in contact with a surface 42 of the vehicle component 40 to make the vehicle component 40 to be functional. The surface 42 of the vehicle component 40 to be covered by the embossed functional leather assembly 2 may be smooth or textured, flat or contoured, and the vehicle component 40 may be rigid or pliant (such as a cushion on a seat). In any event, the embossed functional leather assembly 2 is arranged with respect to the vehicle component 40 in order to make the functional vehicle component 12, which is smart and functional.

The embossed functional leather assembly 2 is arranged on the vehicle component 40 in order to enhance, not only the functionality, but also the aesthetics of the vehicle component 40. The leather substrate 4 is naturally flexible, pliable, and stretchable, and therefore the embossed functional leather assembly 2 is also flexible and can therefore be wrapped around or over, or applied to the vehicle component 40 and conformed to the contours of the surface 42 of the vehicle component 40. The embossed functional leather assembly 2 may be arranged on the vehicle component 40 by stretching and wrapping the embossed leather assembly 2 around the vehicle component 40. The embossed functional leather assembly 2 may be fixed, such as by adhesive or fasteners, to the vehicle component 40. Because the circuit 14, including traces 16, are also flexible, the circuit 14 and traces 16 can at least partially conform to the contours of the surface 42 of the vehicle component 40 without eliminating their functionality. The embossed functional leather assembly 2 may be in direct contact with the surface 42 of the vehicle component 40, or may have one or more optional layers arranged therebetween. Optionally, the embossed functional leather assembly 2 may simply cover or be arranged over the surface 42 of the vehicle component 40.

Once installed in the vehicle, operation of the embossed functional leather assembly 2, the circuit 14, the electrically conductive traces 16, and the associated electronic elements of the circuit 14, may correspond to signals or data derived from one or more electronic systems of a vehicle or may be intermittently or continuously activated during operation of the vehicle. The data or signals may be accessed from, sensed by, generated by, or otherwise acquired from or produced by one or more vehicle electronic systems. Further, the embossed functional leather assembly 2, the circuit 14, the electrically conductive traces 16, and the associated electronic elements of the circuit 14 may provide signals or data to the one or more electronic systems of the vehicle.

The vehicle electronic systems from which this data or these signals may be derived, or to which this data or these signals may be communicated, are not particularly limited and may include one or more vehicle electronic control units (ECU's) associated with a vehicle engine, transmission, body, chassis, passive and active safety features, vehicle performance, driver assistance, interior and exterior environment, vehicle diagnostics, vehicle control, audio/visual entertainment, navigation, electrical systems, telematics, and combinations thereof. The vehicle electronic systems can include a door control unit, engine control unit, electric power steering control unit, human-machine interface (HMI), powertrain control module, transmission control unit; seat control unit, speed control unit, telematics control unit, transmission control unit, brake control module (ABS or ESC), battery management system, central control module, central timing module, general electronic module, body control module, suspension control module, or combinations thereof.

In another embodiment, the embossed functional leather assembly 2 includes a microcontroller 38 electrically connected to the circuit 14, e.g. at an edge of the leather substrate 4. The microcontroller 38 may be electrically connected to the circuit 14 after embossment of the functional leather assembly 2. The microcontroller 38 may be used to make an electrical connection to the circuit 14, and thus may provide communication to and from the one or more conductive traces 16 and electronic elements of the circuit 14, or to control functions of the one or more conductive traces 16 and electronic elements of the circuit 14. The microcontroller 38 may be mounted at the edge of the leather substrate 4 and embossed functional leather assembly 2 before or after the embossed functional leather assembly 2 is fixed over the first side 6 of the vehicle component 40. Various vehicle electronic systems, such as an electronic control unit 32 (ECU), human machine interface 34 (HMI), or vehicle power source 36, may be electrically connected to the functional leather assembly 2 through the microcontroller 38 in order to communicate with the embossed functional leather assembly 2. The circuit 14 may also be electrically connected to the vehicle ECU 32, the vehicle power source 36, the vehicle HMI 34, or other vehicle systems by direct connection with a conductive lead.

The ECU 32 may control operation of the embossed functional leather assembly 2, the electrically conductive traces 16, and the associated electronic elements of the circuit 14. The ECU 32 may be electrically connected to the vehicle power source 36 for powering the ECU 32 and/or the circuit 14.

The HMI 34 may be used to control functioning of the embossed functional leather assembly 2 and the circuit 14, including the electrically conductive traces 16 and the associated electronic elements of the circuit 14. Such arrangement could allow a user to provide input through the HMI 34 to selectively activate the electronic elements of the circuit 14 to perform a particular function. Such user input may be active (user initiated) or passive (sensed input from a user), and can include audible or tactile input. The system may be configured to allow a user to audibly select an operation of the functional leather assembly 2, the circuit 14, the electrically conductive traces 16, and the associated electronic elements of the circuit 14. Alternatively, an operation of the embossed functional leather assembly 2 may be controlled by an integral actuator button (e.g. switch 20) included in the circuit 14.

The circuit 14 and the electronic elements of the circuit 14 may be electrically connected to a power source 36 of the vehicle for providing electrical power to the circuit 14 for activating the electronic elements of the circuit 14. The vehicle power source 36 may comprise a vehicle battery, engine, or alternator, for example. The power source 36 may be connected to the embossed functional leather assembly 2 through the microcontroller 38. In one embodiment, a smart functional vehicle system includes the embossed smart functional leather assembly 2, along with one or more of the microcontroller 38, ECU 32, HMI 34, and vehicle power source 36.

The embossed functional leather assembly 2, including the one or more conductive traces 16 along with the various electronic elements of the circuit 14, may be selectively operable based on a current condition or situation relating to the vehicle or vehicle components, an occupant of the vehicle, or an environment of the vehicle including an immediate or a distant surrounding environment of the vehicle, and combinations thereof. A non-limiting example of the conditions of the vehicle that may be used as a basis for such selective operation include historical, current, or projected vehicle performance characteristics or diagnostic information, or the like. Conditions of the vehicle occupants that may be used as a basis for such selective operation can include a physical condition of a driver, such as the driver being drowsy or inattentive while driving, or the proximity of an object (such as an occupant or an occupants hand) or a global position relative to the vehicle or to the embossed functional leather assembly 2. Conditions of the surrounding environment that may be used as a basis for such selective operation can include proximity of an object (such as another vehicle) to the vehicle, the current time, newsfeeds, amber alerts, nearby points of interest, or the like.

Figure 5:
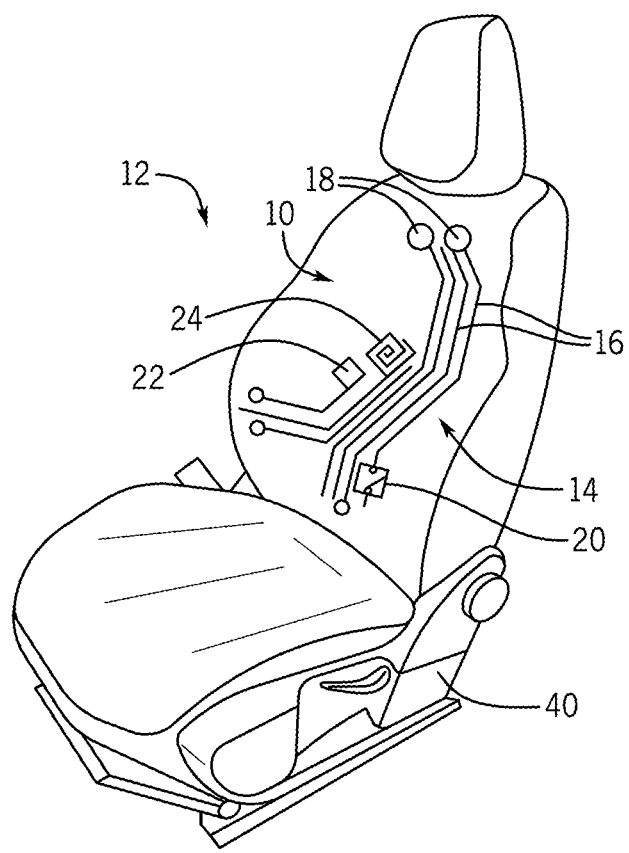
FIG. 5 is a schematic perspective view of a vehicle component including an embossed smart functional leather assembly according to the present subject matter.

With reference to FIG. 5, an illustrative example of the embossed smart functional leather assembly 2 is included as part of a smart functional vehicle component 12 (i.e. vehicle seat). The smart functional vehicle component 12 includes the embossed functional leather assembly 2 arranged on the seat as depicted. It will be appreciated that although visibility of the circuit 14 may be inhibited or prevented by the pigmented coating 26, the circuit 14 in FIG. 5 is schematically depicted in order to indicate its arrangement on the smart functional vehicle component 12. As in other embodiments, the embossed functional leather assembly 2 of the vehicle seat may include one or more electronic elements in the circuit 14. As depicted, the circuit 14 of the embossed functional leather assembly 2 of the seat includes traces 16, light sources 18, a switch 20, a sensor 22, and a wireless transmitter 24. More or less, and different electronic elements may be included in the circuit 14 of the seat, and the functional leather assembly 2 and circuit 14 may be arranged at different locations on the seat, including on the seat cushion, the headrest, or an armrest (not shown).

Figure 3:
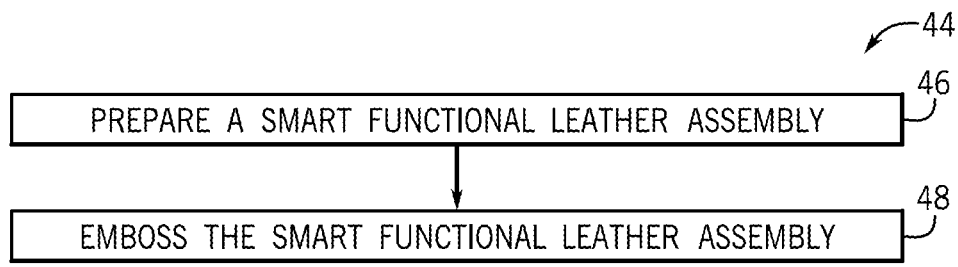
FIG. 3 is a method of preparing an embossed smart functional leather assembly according to the present subject matter.
Figure 4:
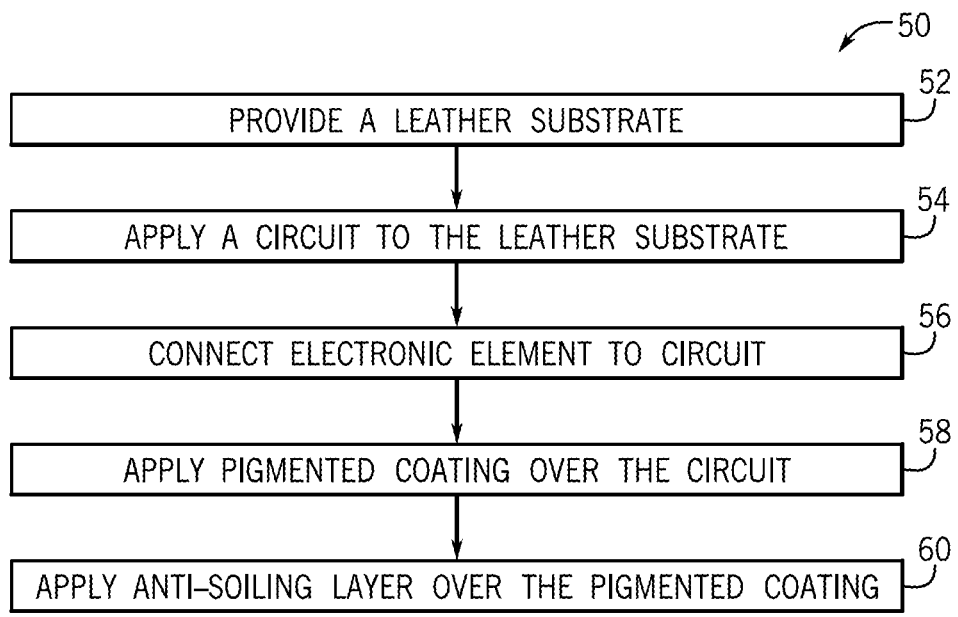
FIG. 4 is a method of preparing a smart functional leather assembly according to the present subject matter according to the present subject matter.

The present subject matter also includes a method 44 of producing an embossed functional leather assembly 2. As depicted in FIG. 3, the method 44 includes a step 46 of preparing a smart functional leather assembly 2, and then a step 48 of embossing the smart functional leather assembly 2. A step 46 of method 44 of FIG. 3 may include, in whole or in part, a method 50 (FIG. 4) of producing a functional leather assembly. The method 50 of FIG. 4 includes a step 52 of providing a leather substrate 4, applying a circuit 14 to the leather substrate 4 at step 54, optionally connecting an electronic element to the circuit 14 at step 56, applying a pigmented coating 26 on the circuit 14 at step 58, and applying an anti-soiling layer 28 on the pigmented coating 26 at step 60.

The leather substrate 4 may be provided in step 52 of method 50, as an animal hide preliminarily prepared before application of the circuit 14 by passing the animal hide through various processes such as soaking, sammying, shaving, fleshing/splitting, drying, staking, and milling. Then, after application of a base coat, the hide may be set aside to rest. The hide may then be cut to a predetermined shape to produce a leather substrate 4 that can be arranged on a particular vehicle component 40.

An electronic circuit 14 may then be applied in step 54 of method 50 by printing a conductive ink on the first side 6 of the leather substrate 4. The conductive ink can be applied through any suitable process or technique, and in an illustrative embodiment, is applied by one or more of (a) screen printing, (b) aerosol jet printing, and (c) inkjet printing. One or more electronic elements (e.g. a light source 18 such as a micro LED) may optionally be arranged on the leather substrate 4 as part of the circuit 14 in step 56 of method 50.

Then, the pigmented coating 26 can be applied on the circuit 14 in step 58 of method 50. The pigmented coating 26 can include one or more separately applied layers with each including pigment, such that the pigmented coating 26 may inhibit or prevent the circuit 14 from being visible therethrough. The anti-soiling layer 28 is optionally applied on the pigmented coating 26 in step 60 of method 50 to thereby produce a functional leather assembly 2. Step 60 optionally includes applying an acrylic urethane resin anti-soiling component as part of the pigmented coating 26, and/or as a topcoat (i.e. an anti-soiling layer 28) that is separate from and applied over the pigmented coating 26.

The functional leather assembly 2 is then embossed in step 48 of method 44. Embossment may be accomplished by roll-to-roll embossing, for example, by sending the functional leather assembly 2 through two embossing rollers 30, 30 as indicated by the left-pointing arrow in FIG. 2, which thereby results in an embossed functional leather assembly 2. Embossment is performed such that the circuit 14 and associated electronic elements of the circuit 14 do not lose functionality. The embossed functional leather assembly 2 can be arranged on a vehicle component 40 so as to form a functional surface coving for the vehicle component 40, which can then be used as a functional interior panel, seat, or steering wheel, for example. The method may also include connecting a microcontroller 38 to the circuit 14, for optional connection to a power source 36, ECU 32, and/or HMI 34, to allow the circuit 14 to perform an operation.

It will be appreciated that various of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims

The invention claimed is:

1. A functional leather assembly defining a first surface and a second surface opposite from the first surface, the functional leather assembly including:
   a leather substrate comprising a first side facing the first surface of the functional leather assembly, and a second side opposite from the first side and facing the second surface of the functional leather assembly; and
   an electrically conductive trace arranged on the first side of the leather substrate;
   an embossed texture embossed directly into the first side of the leather substrate.

2. The functional leather assembly according to claim 1, further including a wireless transmitter on the first side of the leather substrate and electrically connected to the electrically conductive trace.

3. The functional leather assembly according to claim 1, wherein the electrically conductive trace includes a printed and cured electrically conductive ink.

4. The functional leather assembly according to claim 1, further including a light source on the first side of the leather substrate and electrically connected to the electrically conductive trace, the light source configured to emit light to provide illumination.

5. The functional leather assembly according to claim 1, further including a pressure sensor on the first side of the leather substrate and electrically connected to the electrically conductive trace.

6. The functional leather assembly according to claim 1, wherein the embossed texture includes one or more of:
   a roll-to-roll embossed texture;
   a roll-to-plate embossed texture;
   a roll-to-die embossed texture;
   a stamped embossed texture;
   a clamped embossed texture;
   a punched embossed texture; and
   a pressed embossed texture.

7. The functional leather assembly according to claim 1, further comprising a microcontroller on the leather substrate and electrically connected to the electrically conductive trace, the microcontroller being configured to connect to an electronic control unit, a human machine interface, a power source, or combinations thereof.

8. The functional leather assembly according to claim 1, further comprising a pigmented coating on the first side of the leather substrate and covering the trace.

9. A functional leather assembly defining a first surface and a second surface opposite from the first surface, the functional leather assembly including:
- a leather substrate comprising a first side facing the first surface of the functional leather assembly, and a second side opposite from the first side and facing the second surface of the functional leather assembly; and
- a first electrically conductive trace arranged on the first side of the leather substrate;
- a first electronic component arranged on the first side of the leather substrate, electrically connected to the first electrically conductive trace, and having a first functionality;
- a second electrically conductive trace arranged on the first side of the leather substrate and electrically isolated from the first conductive trace;
- a second electronic component arranged on the first side of the leather substrate, electrically connected to the second electrically conductive trace, and having a second functionality different than the first functionality; and
- an embossed texture embossed into the first surface of the functional leather assembly.

10. The functional leather assembly according to claim 9, wherein the second electrically conductive trace overlaps the first electrically conductive trace.

11. The functional leather assembly according to claim 10, further including a dielectric layer arranged between the first electrically conductive trace and the second electrically conductive trace, wherein the dielectric layer electrically isolates the second electrically conductive trace from the first electrically conductive trace.

12. The functional leather assembly according to claim 11, wherein the first electronic component includes a light source and the second electronic component includes a wireless transmitter.

13. The functional leather assembly according to claim 12, further including a pressure sensor electrically connected to either the first electrically conductive trace or the second electrically conductive trace.

14. The functional leather assembly according to claim 11, wherein the light source emits light for indicating a location of the wireless transmitter.

15. The functional leather assembly according to claim 14, wherein the light source emits the light when a portable electronic device is within a predetermined distance from the functional leather assembly.

16. The functional leather assembly according to claim 9, wherein the first electrically conductive trace and the second electrically conductive trace include a printed and cured electrically conductive ink.

17. The functional leather assembly according to claim 9, wherein the embossed texture includes one or more of:
- a roll-to-roll embossed texture;
- a roll-to-plate embossed texture;
- a roll-to-die embossed texture;
- a stamped embossed texture;
- a clamped embossed texture;
- a punched embossed texture; and
- a pressed embossed texture.

18. The functional leather assembly according to claim 9, further comprising a microcontroller on the leather substrate and electrically connected to the first electrically conductive trace and to the second electrically conductive trace, the microcontroller being configured to connect to an electronic control unit, a human machine interface, a power source, or combinations thereof.

19. The functional leather assembly according to claim 9, further comprising a pigmented coating on the first side of the leather substrate and covering the first electrically conductive trace, the second electrically conductive trace, the first electronic component, and the second electronic component.

20. The functional leather assembly according to claim 9, further including an anti-soiling component layer arranged on the first side of the leather substrate and over the first electrically conductive trace and the second electrically conductive trace.

* * * * *